United States Patent [19]

Houston

[11] Patent Number: 5,198,710
[45] Date of Patent: Mar. 30, 1993

[54] BI-DIRECTIONAL DIGITAL NOISE GLITCH FILTER

[75] Inventor: Theodore W. Houston, Richardson, Tex.

[73] Assignee: Texas Instruments Incorporated, Dallas, Tex.

[21] Appl. No.: 707,517

[22] Filed: May 30, 1991

[51] Int. Cl.$^5$ ........................ H03K 5/22; H03K 17/16
[52] U.S. Cl. .................................. 307/520; 307/234; 307/443; 307/268; 328/111; 328/167
[58] Field of Search .............. 307/520, 521, 234, 268, 307/443, 265; 328/111, 55, 165, 167

[56] References Cited

U.S. PATENT DOCUMENTS

| | | | |
|---|---|---|---|
| 3,970,944 | 7/1976 | Huellwegen | 307/234 |
| 4,061,975 | 12/1977 | Sugai | 307/234 |
| 4,061,976 | 12/1977 | Sugai | 328/112 |
| 4,233,525 | 11/1980 | Takahashi et al. | 307/234 |
| 4,567,601 | 1/1986 | Mountain | 328/111 |
| 4,716,318 | 12/1987 | Koike | 307/520 |
| 4,760,279 | 7/1988 | Saito et al. | 307/520 |
| 4,857,760 | 8/1989 | Stuebing | 328/111 |
| 5,019,724 | 5/1991 | McClure | 307/443 |

*Primary Examiner*—Timothy P. Callahan
*Attorney, Agent, or Firm*—Ira S. Matsil; James C. Kesterson; Richard L. Donaldson

[57] ABSTRACT

A bi-directional digital noise filter will eliminate glitches of one delay while adding only one delay to the information signal. A first embodiment digital noise glitch filter 8 comprises a two asymmetric delay elements 10 and 12 connected in series. The first element 10 has a delay of equal duration as the longest glitch to be filtered and the second element 12 has a delay twice as long as the first delay. A third asymmetrical delay circuit 20 coupled in parallel the other delays has the first delay. Other systems and methods are also disclosed.

9 Claims, 9 Drawing Sheets

1

BI-DIRECTIONAL DIGITAL NOISE GLITCH FILTER

FIELD OF THE INVENTION

This invention generally relates to the fabrication of semiconductor devices and specifically to a bi-directional noise filter.

BACKGROUND OF THE INVENTION

In asynchronous digital logic circuits, signals propagate throughout the circuit to create the desired results. In designing these circuits careful attention must be paid to gate delays to ensure proper device operation. To maximize operating speed these delays must be minimized.

One problem which may occur in digital circuits is a noise "glitch" wherein a logic level incorrectly changes polarity for a short amount of time. This erroneous transition may propagate throughout the circuit. For example, in a memory array if the address is latched during a noise glitch, the wrong address will result which may lead to an unrecoverable system error.

In prior art methods, glitch filters have been developed which will eliminate the possibility of glitches of a certain time length. The problem with these filters is the relatively long delay compared with the duration of the glitch to be filtered. The delays caused by the glitch filters undesirably slow the circuit.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for eliminating a noise glitch in a digital signal.

A first embodiment digital noise glitch filter comprises two asymmetric delay elements connected in series. The first element has a delay of equal duration as the longest glitch to be filtered and the second element has a delay twice as long as the first delay. A third asymmetrical delay circuit coupled in parallel the other delays has the first delay. The filter will eliminate glitches of one delay while adding only one delay to the information signal.

A second embodiment digital noise filter comprises asymmetric delay circuitry for removing a high-going glitch and asymmetric delay circuitry for removing a low-going glitch. A tri-state buffer coupled to an output of both asymmetric delay circuits.

An advantage of the invention is that noise glitches of a selected duration ($\Delta$ seconds, for example) are eliminated while adding only approximately a delay the same selected duration (i.e., $\Delta$ seconds) to the logic signal. This capability is an advantage over the prior art since it helps ease the burden of the glitch width filtering capability versus time delay tradeoff.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the apparatus and method of the present invention. The preferred embodiment will be described first followed by a description of modifications and variations.

Figure 1:
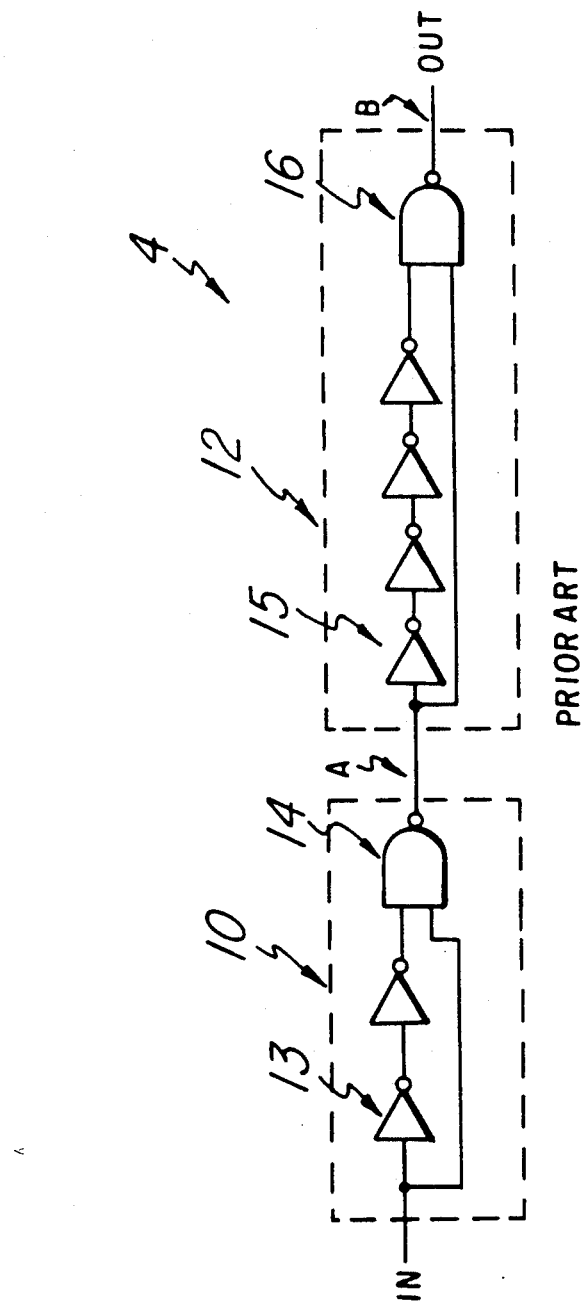
FIG. 1 is a sample prior art glitch filter.

Referring first to FIG. 1, a prior art glitch filter 4 is shown. Glitch filter 4 consists of asymmetrical delay element 10 which is connected in series with asymmetrical delay element 12. Delay elements 10 and 12 are considered asymmetrical because the time to propagate a transition from a "High" level to a "Low" level is different than the time to propagate a transition from a "Low" level to a "High" level.

Asymmetrical delay element 10 comprises a plurality of inverters 13 connected in series. The output of the final inverter is connected to one input of two input NAND gate 14. The signal to be filtered IN is coupled to the input of the first inverter 13 as well as the other input of NAND gate 14. The delay of the inverter chain 13 is $\Delta$ seconds where $\Delta$ seconds is the duration of the widest glitch to be filtered. The output A of delay element 10 is connected to the input of delay element 12.

Asymmetrical delay element 12 may be structurally the same as delay element 10 but has a delay that is twice that of asymmetrical delay element 10, in other words a delay of $2\Delta$ seconds. In the case shown, twice as many inverters 14 are used. This increased delay is necessary because asymmetrical delay 10 will eliminate a high-going glitch (i.e., a glitch in a logical "0") but will double the duration of a low-going glitch. The delay element 12 will eliminate this glitch. A detailed illustration of the signal levels with time is shown below with reference to FIG. 3.

Figure 2:
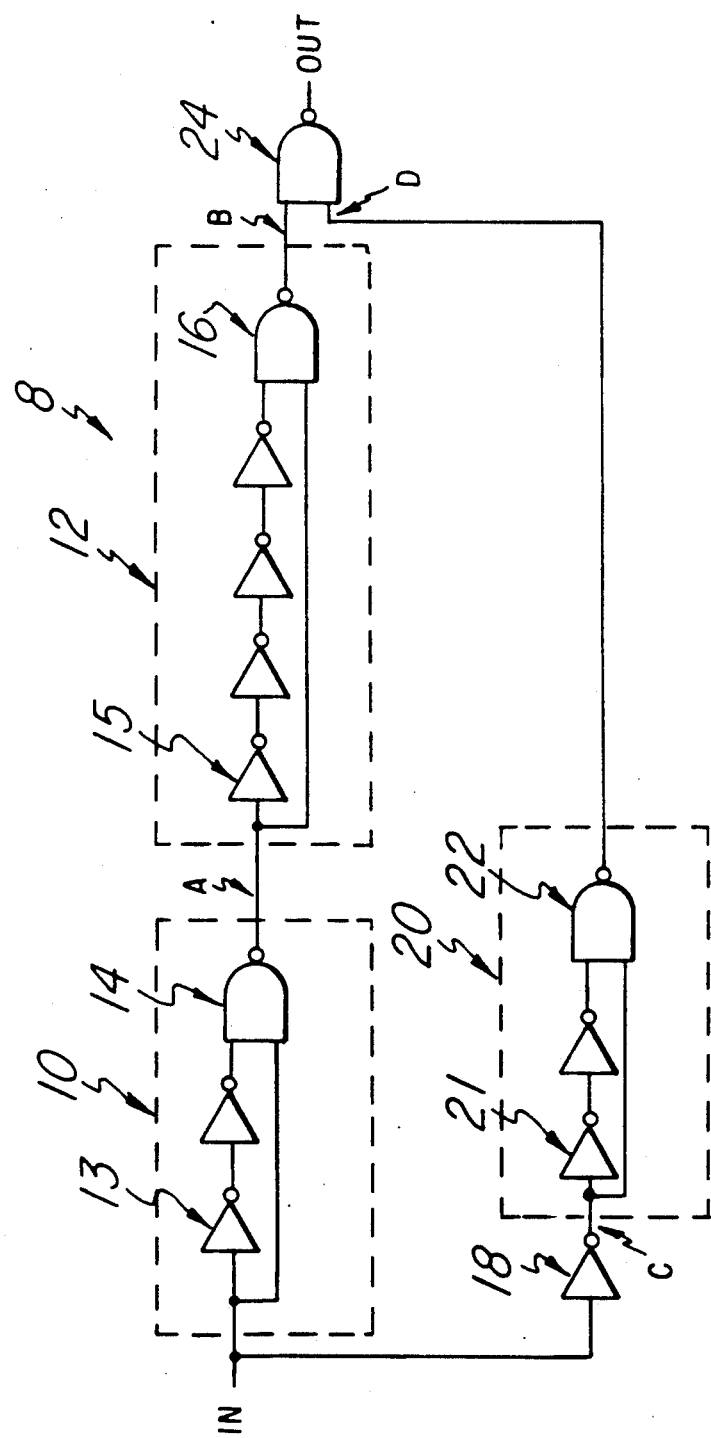
FIG. 2 is a first preferred embodiment glitch filter.

A first preferred embodiment of the present invention is shown in FIG. 2. The glitch filter 8 comprises a first asymmetrical delay element 10 connected in series with a second asymmetrical delay element 12. The delay elements 10 and 12 are as described above with reference to FIG. 1. The delay $\Delta$ of element 10 is half the delay $2\Delta$ of element 12. Although shown with two inverters 13, the delay of element 10 may be achieved by any delay means including an inverter chain with more than two inverters, an inverter chain with a feedback capacitor (not shown) or both, as other examples. The same concept applies for delay element 12. Asymmetrical delay element 10 may be structurally the same as delay element 12 but does not need to be.

The input signal IN is coupled to the input of delay element 10 and also to the input of inverter 18. Inverter 18 is a fast inverter with a negligibly small (relative to Δ) delay. The output C of inverter 18 is coupled to a third asymmetrical delay element 20. Asymmetrical delay element 20 may comprise an inverter chain 21 and NAND gate 22 for example. The delay Δ of element 20 is the same as the delay Δ of element 10.

The output D of delay element 20 is connected to one input of a two-input NAND gate 24. The output B of delay element 12 is connected to the other input of NAND gate 24. The output OUT of NAND gate 24 is the output of glitch filter 8.

Figure 3:
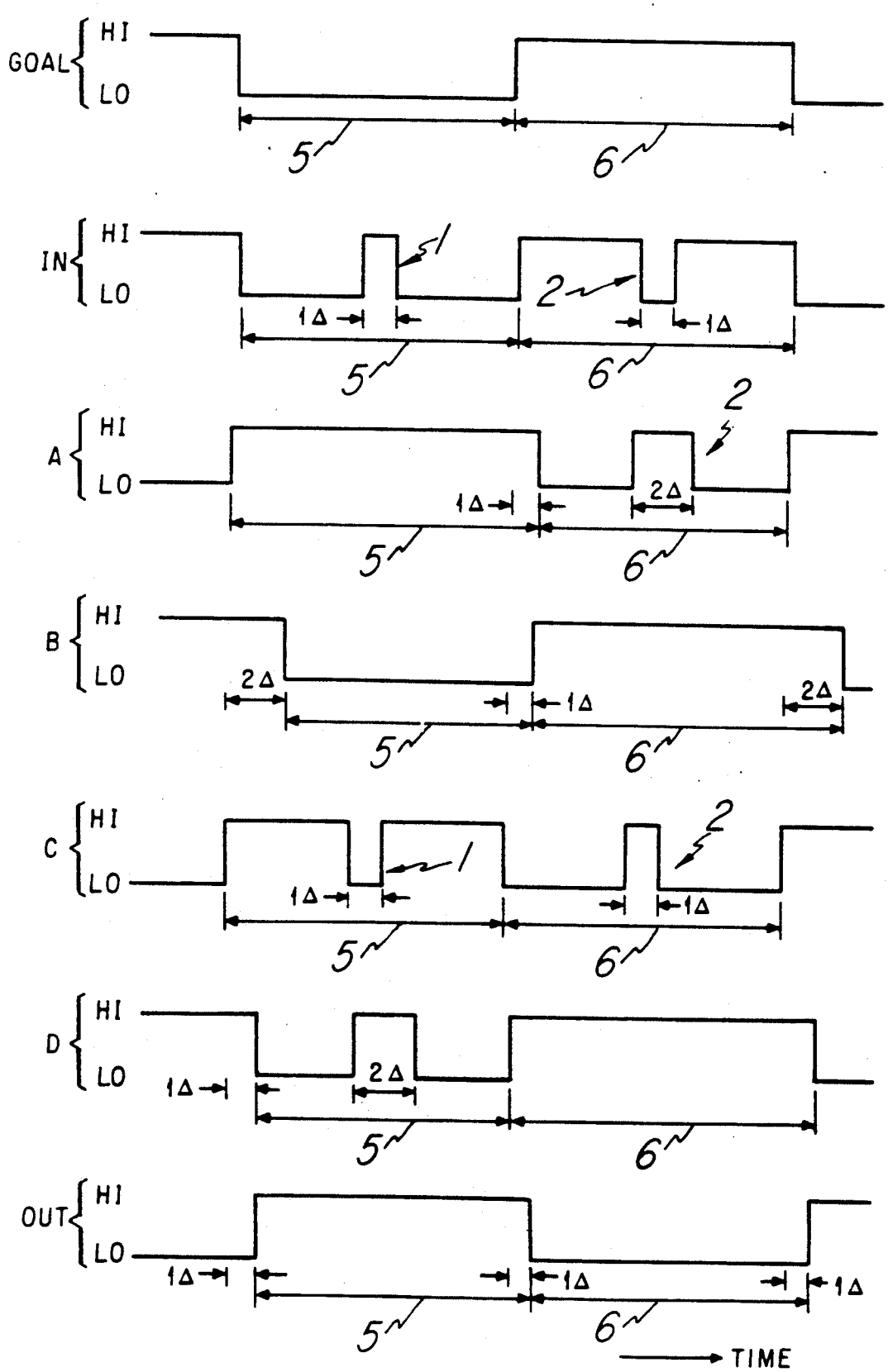
FIG. 3 is a timing diagram for the filter of FIG. 2.

The advantage of the present invention will best be understood with reference to the timing diagrams illustrated in FIG. 3. All of the graphs in FIG. 3 illustrate logic levels, either Hi (logical "1") or Lo (logical "0"), as a function of time.

Referring now to FIG. 3 along with FIG. 2, an ideal digital signal GOAL is shown. The illustrative signal GOAL comprises logic signal 5 which is Lo (logic "0") and logic signal 6 which is Hi (logic "1"). The signal GOAL, however, has been corrupted by noise: a high-going noise glitch 1 in signal 5 and a low-going noise glitch 2 in signal 6 and is illustrated as signal IN. The widths of noise glitch 1 and noise glitch 2 are each Δ seconds. The goal of the filter is to eliminate glitches 1 and 2 with a relatively small delay.

The output A of delay element 10 is illustrated next. Here the high-going glitch 1 has been eliminated and no delay has been introduced to the now inverted logic signal 5. The low going glitch 2, however, has been doubled in duration and a delay of Δ has been introduced to the leading edge of the now inverted logic signal 6.

The next timing plot shown is that of the output B of delay element 12. Here logic signal 5 has been inverted back to a Lo and the trailing edge has been delayed by 2Δ seconds, the delay of element 12. In logic signal 6, the glitch 2 has been eliminated without any additional trailing edge delay. The output B is the same as the filter output OUT of the prior art filter 4 shown in FIG. 1.

The output C of fast inverter 18 is illustrated next. The output C is simply an inversion of input signal IN. The glitches 1 and 2 both remain and are still Δ seconds in duration.

Next illustrated is the output D of delay element 20. Here, now inverted logic signal 5 has been delayed by Δ seconds and noise glitch 1 has been doubled in duration. The noise glitch 2, however, has been eliminated from logic 6 without any significant additional delay.

The output signal OUT is determined by nanding (in gate 24) signal B with signal D. The output signal OUT is an inverted representation of the desired signal GOAL delayed by Δ seconds. Comparing signal OUT with signal B (the output signal of prior art filter 6), a 50% reduction in the delay of logic signal 5 has been achieved. This increase in speed provides an advantage over prior art glitch filters.

During the discussion with respect to FIG. 3, the delay of NAND gates 14, 16, 22 and 24 and of inverter 18 were neglected since they are negligibly small relative to the delay Δ. These delays may be easily included in the analysis with little change to the end result. The digital signal will be provided to the output approximately Δ seconds (i.e., Δ plus the small gate delays) after the signal is applied to the glitch filter.

Figure 4:
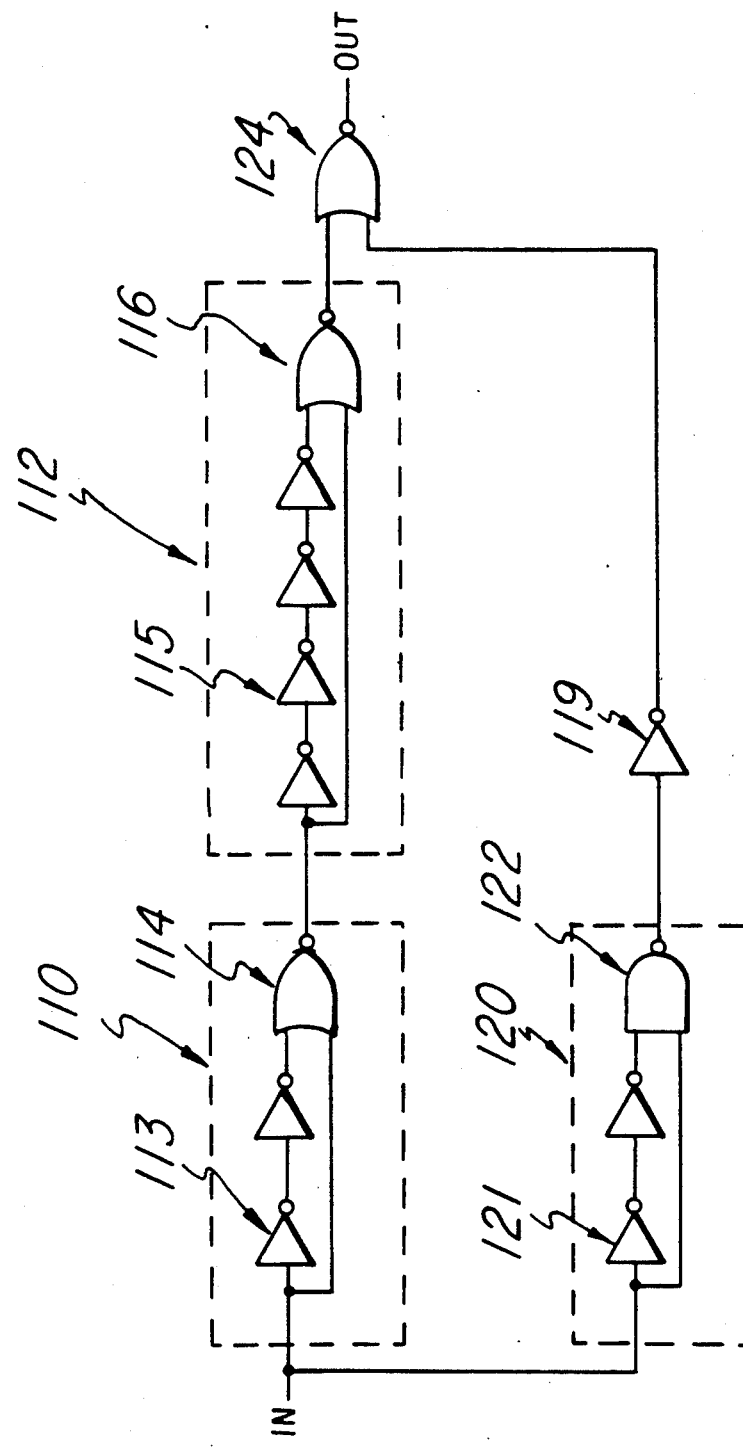
FIG. 4-6 are alternate embodiment glitch filters.

Many modifications and variations of the present invention are possible and will be obvious to those skilled in the art. FIG. 4 illustrates an alternate embodiment wherein NOR gates 114 and 116 are used in place of NAND gates 14 and 16 in asymmetrical delay elements 110 and 112 respectively. In addition, an inverter 119 may be added after delay element 120 and a NOR gate 124 used to determine the output signal OUT.

Figure 5:
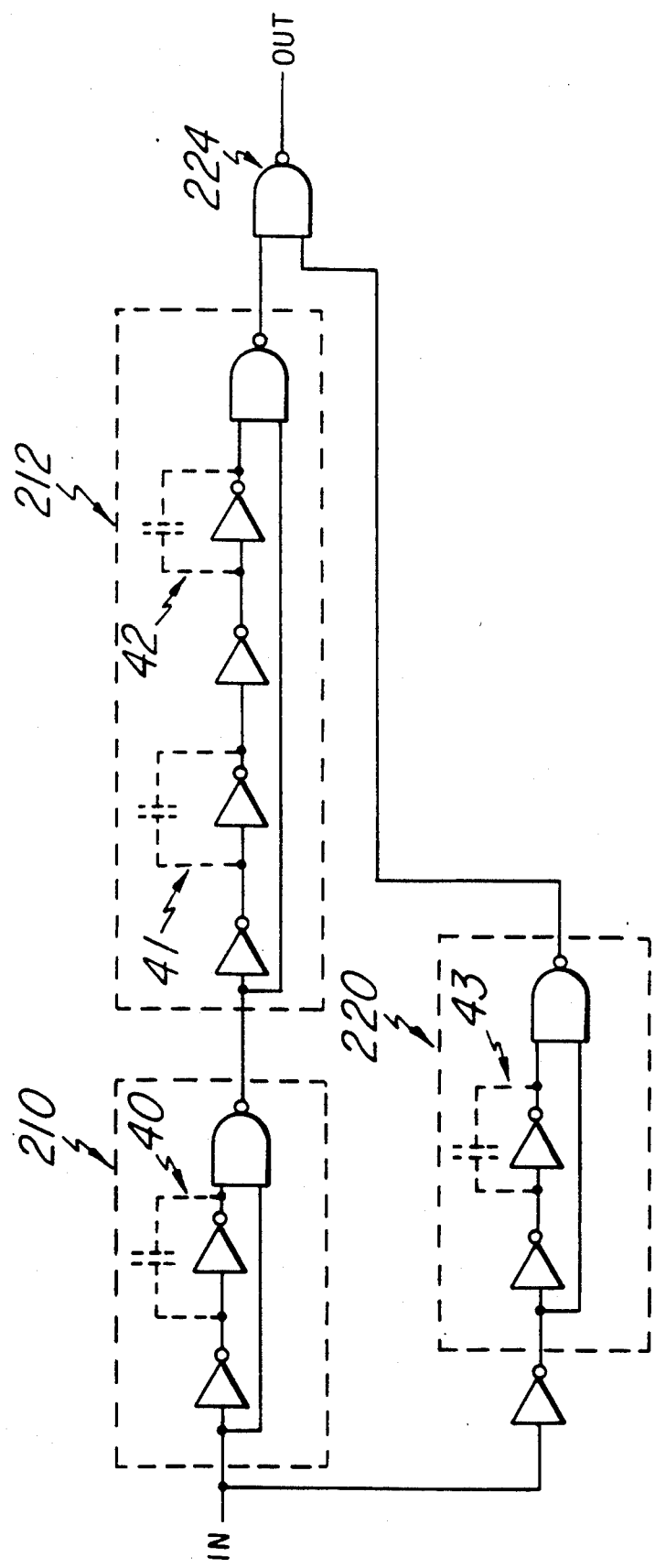

An embodiment which outputs a non-inverted filtered version of the input signal is illustrated in FIG. 5. The circuit of FIG. 5 is the same as the circuit of FIG. 2 except that NAND gate 24 has been replaced with AND gate 224. Of course, the same result may be achieved with the addition of a fast inverter (not shown) at the output of NAND gate 24 of FIG. 2.

Also illustrated in FIG. 5 are feedback capacitors 40-43 which are used in the delay elements to provide additional delay, as known in the art. Feedback capacitors may be used in any of the embodiments described herein or the modifications thereof to design for the elimination of a specific duration glitch.

Figure 6:
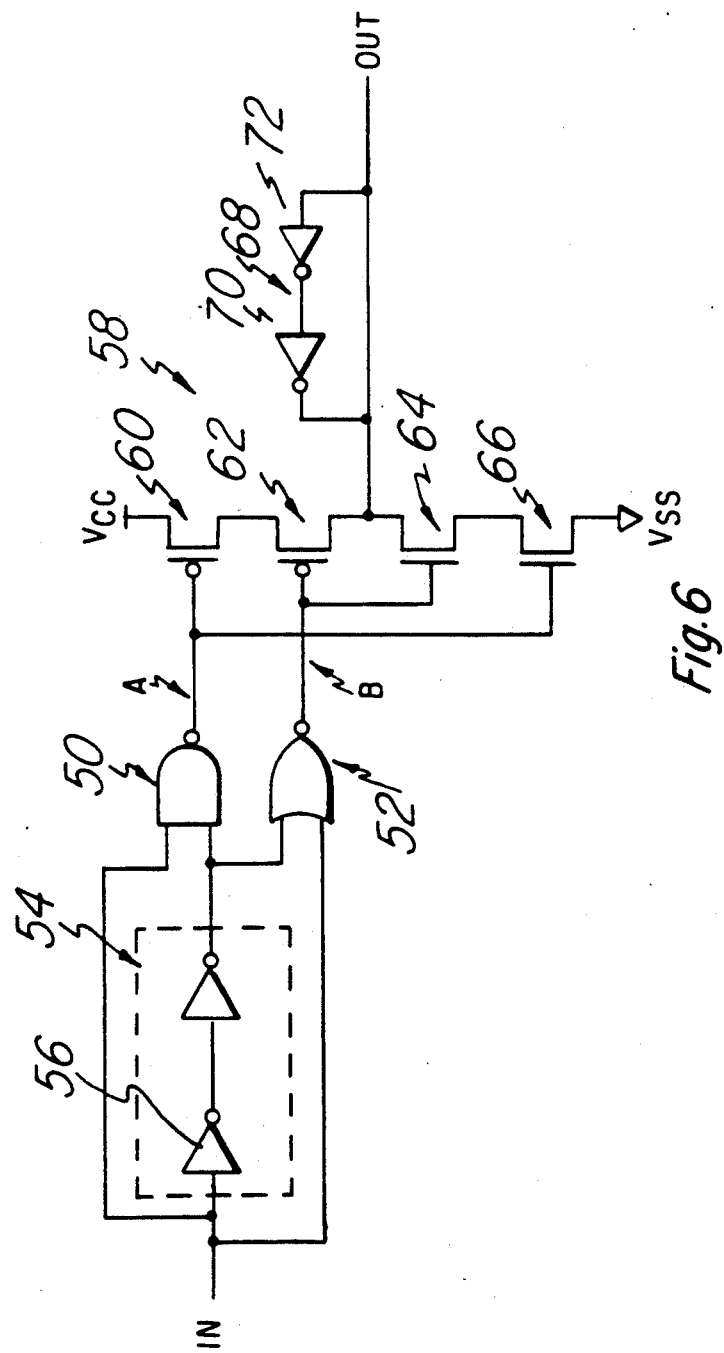

Referring now to FIG. 6, an alternate embodiment glitch noise filter is shown. A digital input signal IN is coupled to one input of an at least two-input NAND gate 50, one input of an at least two-input NOR gate 52, and the input of a delay circuit 54. In the embodiment shown, the delay circuit 54 comprises a plurality of inverters 56. The number of inverters 56 used will depend upon the desired delay Δ, which directly corresponds to the duration glitch which must be filtered out. An even number of inverters are used to achieve an non-inverting delay. Although shown as a chain of inverters 56, any delay element 54 may be used. The output of delay element 54 is coupled to the other input of NAND gate 50 and the other input of NOR gate 52.

The output A of NAND gate 50 is coupled to the gate of p-channel MOS transistor 60 and the gate of n-channel MOS transistor 66. Likewise, the output B of NOR gate 52 is coupled to the gate of p-channel MOS transistor 62 and the gate of n-channel MOS transistor 64. The power supply voltage Vcc may typically, but not necessarily, be +5 volts and the ground voltage Vss may typically, but not necessarily, be zero volts.

The transistors 60 through 66 are connected together to form a CMOS tri-state inverter 58 as is well known in the art. When the inputs A and B to inverter 58 are both high (e.g., +5 volts), the output OUT will be low (i.e., approximately Vss volts). Likewise, when the inputs A and B to inverter 58 are both low (e.g., 0 volts), the output OUT will be high (i.e., approximately Vcc volts). When the inputs A and B are different, however, the inverter 58 will go into a high impedance state.

Weak latch 68, which in the illustrative example comprises inverters 70 and 72, is provided to maintain the output signal OUT when the tri-state inverter 58 is in the high impedance state. The weak latch 68 is weak enough such that it is overcome by the driver when either both p-channel transistors 60 and 62 and both n-channel transistors 64 and 66 are either "on" or "off". The function of latch 68 may be accomplished by any mechanism which will maintain a voltage for twice the desired delay period (i.e., twice the duration of the widest glitch). For example, if the capacitance on the output line is great enough to hold the voltage for twice the desired delay period, the latch 68 will not be needed.

Figure 7:
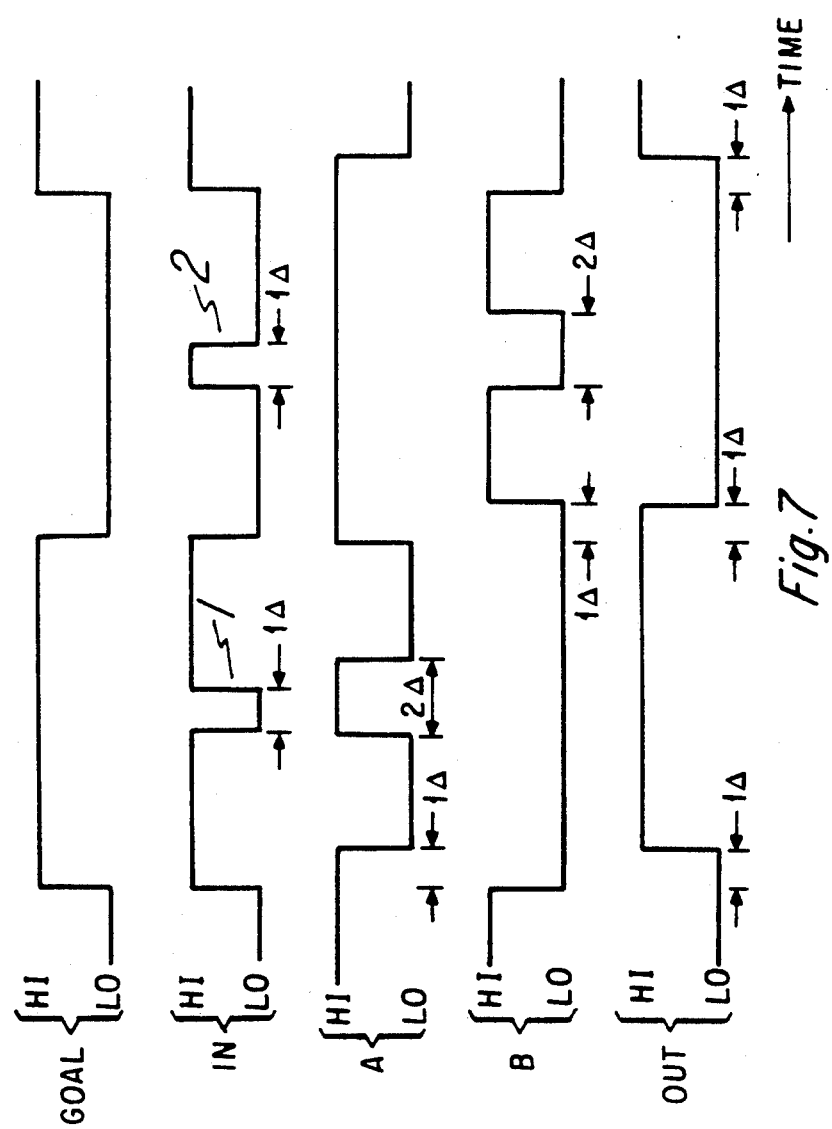
FIG. 7 is an timing diagram for the filter of FIG. 6

The operation of the glitch filter shown in FIG. 6 will best be understood with reference to the timing diagram shown in FIG. 7 along with FIG. 6. All of the graphs in FIG. 7 illustrate logic levels, either Hi (logical "1") or Lo (logical "0"), as a function of time.

The signal GOAL is the ideal desired signal. The desired signal GOAL, however, has been corrupted by noise and now includes glitches 1 and 2, which may be as long as Δ seconds in duration. The object of the circuit is to remove glitches 1 and 2 while minimizing the additional delay. The corrupted input signal IN is shown in the second plot.

The output A of NAND gate 50 is shown next. The high-going glitch 2 is eliminated but the low-going glitch 1 has been doubled in duration.

The output B of NOR gate 52 is illustrated next. The filtering mechanism here is opposite what it was for A. In other words, the low-going glitch 1 is eliminated but the high-going glitch 2 has been doubled in duration.

Signals A and B are input into CMOS inverter 58 to generate the signal OUT. The signal OUT is an exact duplication of the signal GOAL except it is delayed by one delay period Δ. The duration of delay Δ is the same as the delay of delay element 54 and corresponds to the maximum width glitch which will be eliminated.

In prior art noise glitch filters, a delay of greater than Δ is required to eliminate a glitch Δ seconds long. For example, the filter of FIG. 1, has a delay of 2Δ to eliminate a high-going glitch. Therefore, a 50% reduction in delay is achieved by the embodiment shown in FIG. 6.

During the discussion with respect to FIG. 7, the delay of NAND gate 50, NOR gate 52 and tri-state inverter 58 were ignored since they are negligibly small relative to the delay of delay element 54. These delays may be easily included with little change to the end result. The digital signal will be provided to the output approximately Δ seconds (i.e., Δ plus the small gate delays) after the signal is applied to the glitch filter.

The concept described with reference to FIG. 6 may be extended to technologies other than CMOS such as TTL or ECL, as examples. In addition, the logic gates used may be varied. The essence is that the signal is divided into two paths, one of which filters high-going glitches and the other of which filters low-going glitches. The two signals are brought together at a driver that is high impedance when the two filtered signals are in opposite states.

Figure 8:
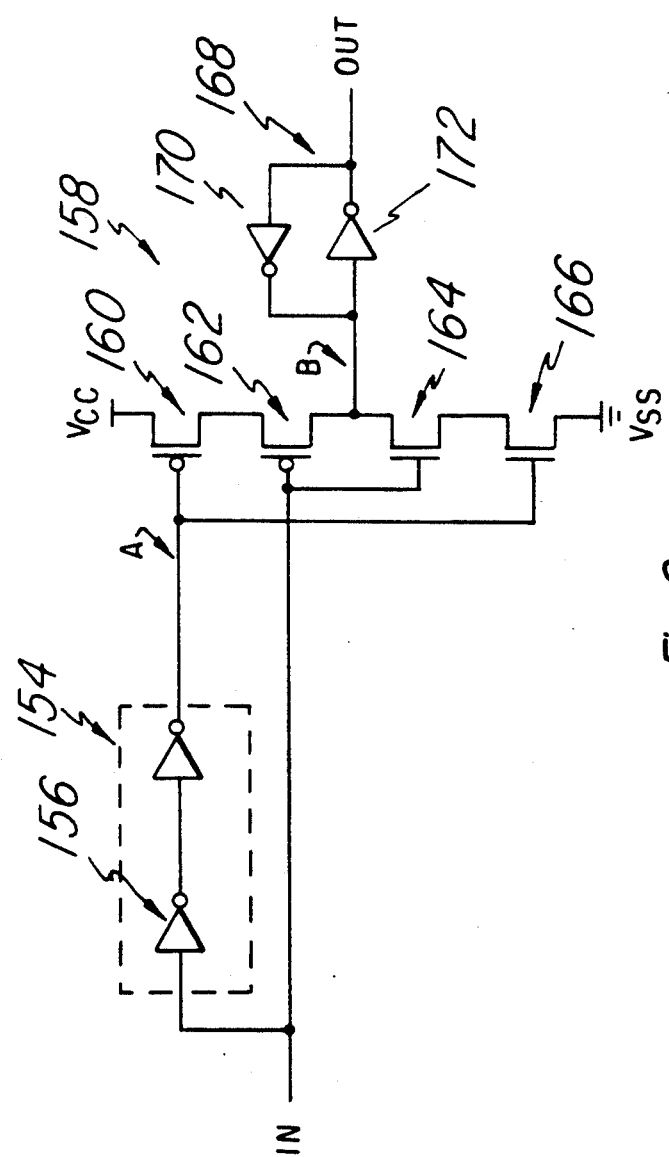
FIG. 8 is an alternate embodiment glitch filter.

A preferred embodiment, which is a modification of the glitch filter shown in FIG. 6, is shown in FIG. 8. In this embodiment the input signal IN is coupled directly to the gates of n-channel transistor 164 and p-channel transistor 162. The input signal IN is also applied to the input of a delay element 154, which may comprise an inverter chain or any of the variations discussed herein. The delayed signal A is coupled to the gates of n-channel transistor 160 and p-channel transistor 166. The MOS transistors 160–168 are connected to create a tri-state inverter as described above with reference to FIG. 6. Weak latch 168 may also be included as discussed previously.

Figure 9:
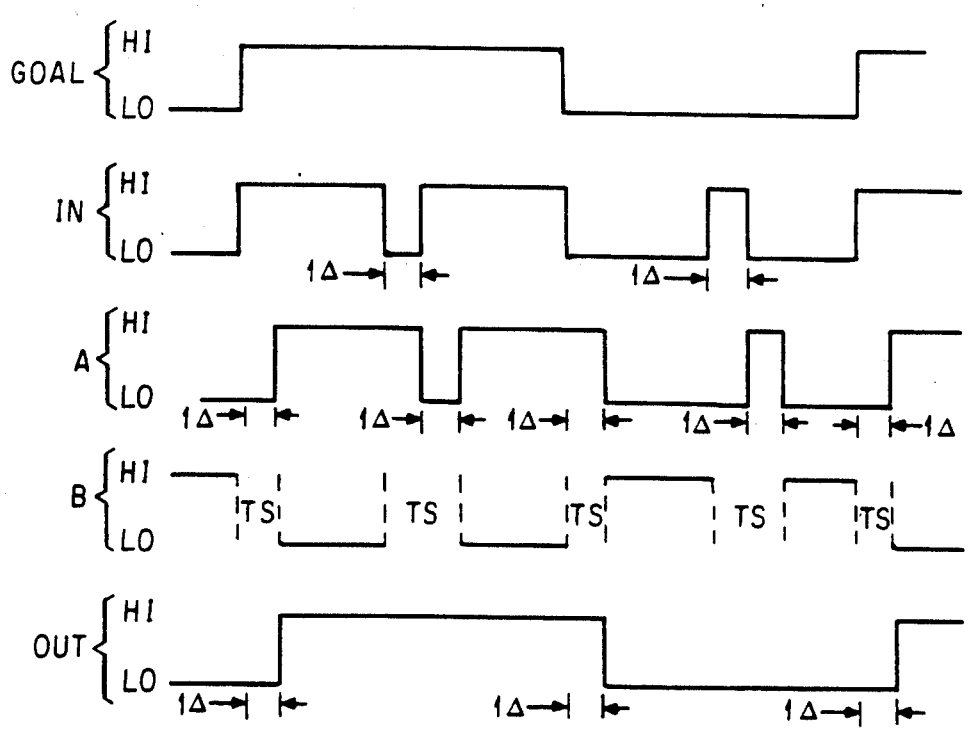
FIGS. 9-10 are timing diagrams for the filter of FIG. 8.

The worst case timing diagram for the circuit of FIG. 8 is shown in FIG. 9. Once again the output signal OUT is delayed by one time period Δ but does not include the glitches which were present in the corrupted input signal IN.

Figure 10:
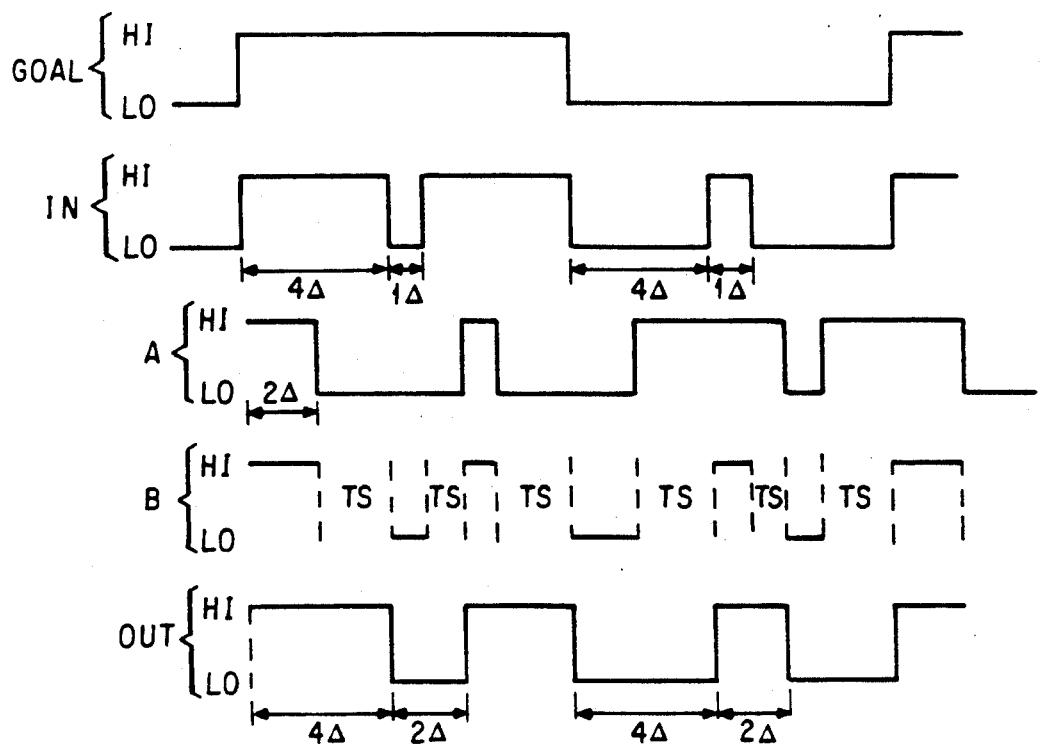

Typically the delay element 154 is a non-inverting delay, for example an even number of inverters connected in series. An inverting delay, such as an odd number of series inverters, may also be used. This output signal may be used for diagnostic purposes, for example. In this case, the output will be a pulse equal to or greater than some minimum pulse. That is, it will widen narrow glitches and pass wider pulses unchanged. An example timing diagram is shown in FIG. 10. In this example, the duration 2Δ of the delay 154 is twice that of the longest glitch Δ and the glitches are each expanded to 2Δ in duration. The duration of the delay element 154 may be adjusted to give the desired time response.

Once again, many modifications and variations are possible. The tri-state buffer may be formed using TTL or ECL technologies and delays other than inverter chains may be used. The weak latch 168 may be unnecessary if the line capacitance is high enough to hold the charge.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A digital noise glitch filter which includes an input and an output, comprising:
   a first asymmetric delay element with a first delay wherein the time to propagate a transition from a high level to a low level is different than the time to propagate a transition from said low level to said high level, the input of said first asymmetrical delay element is coupled to said glitch filter input;
   a second asymmetric delay element with a second delay connected such that the input of said second asymmetric delay element is coupled to the output of said first asymmetric delay element, and wherein said second delay is at least twice said first delay;
   a third asymmetric delay circuit with a third delay which is substantially equal to said first delay, the input of said first asymmetrical delay element is coupled to said glitch filter input;
   a logic element with at least two inputs wherein the output of said second asymmetric delay element is coupled to an input of said logic element and wherein the output of said third asymmetric delay element is coupled to another input of said logic element and wherein the output of said logic element comprises said glitch filter output.

2. The filter of claim 1 wherein said first asymmetric delay comprises a selected number of inverters, including a first and a last inverter, connected in series wherein the input of said first inverter is coupled to a first input of a logic gate and the output of said last inverter is coupled to a second input of said logic gate.

3. The filter of claim 2 wherein said logic gate comprises a NAND gate.

4. The filter of claim 2 and further comprising a feedback capacitor connected between the input of one of said inverters and the output of one of said inverters.

5. The filter of claim 2, wherein said selected number is two.

6. The filter of claim 1 wherein said second asymmetric delay comprises a selected number of inverters, including a first and a last inverter, connected in series wherein the input of said first inverter is coupled to a first input of a logic gate and the output of said last inverter is coupled to a second input of said logic gate.

7. The filter of claim 1, wherein said third asymmetric delay structurally equivalent to said first asymmetric delay.

8. The filter of claim 1, wherein said logic element comprises a NAND gate.

9. The filter of claim 1, wherein said logic element comprises a NOR gate.

* * * * *